(12) United States Patent
Shalish (10) Patent No.: US 7,185,308 B2
(45) Date of Patent: Feb. 27, 2007

(54) CORRELATION OF BEHAVIORAL HDL SIGNALS

(76) Inventor: Khalil Shalish, 9708 Indigo Brush Dr., Austin, TX (US) 78726

( * ) Notice: Subject to any disclaimer, the term of this patent is extended or adjusted under 35 U.S.C. 154(b) by 571 days.

(21) Appl. No.: 10/384,013

(22) Filed: Mar. 7, 2003

(65) Prior Publication Data

US 2003/0154459 A1     Aug. 14, 2003

Related U.S. Application Data

(63) Continuation of application No. 09/741,698, filed on Dec. 19, 2000, now Pat. No. 6,557,160.

(60) Provisional application No. 60/171,416, filed on Dec. 21, 1999.

(51) Int. Cl.
*G06F 17/50* (2006.01)
(52) U.S. Cl. ............................. 716/18; 716/2
(58) Field of Classification Search ................. 716/18, 716/2
See application file for complete search history.

(56) References Cited

U.S. PATENT DOCUMENTS

| | | | |
|---|---|---|---|
| 5,146,583 A | 9/1992 | Matsunaka et al. | 716/3 |
| 5,465,216 A | 11/1995 | Rotem et al. | 716/5 |
| 5,537,580 A | 7/1996 | Giomi et al. | 716/19 |
| 5,841,663 A | 11/1998 | Sharma et al. | 716/18 |
| 5,937,190 A | 8/1999 | Gregory et al. | 717/131 |
| 5,949,691 A | 9/1999 | Kurosaka et al. | 716/5 |
| 6,132,109 A | 10/2000 | Gregory et al. | 717/131 |
| 6,145,117 A | 11/2000 | Eng | 716/18 |
| 6,223,142 B1 | 4/2001 | Bargh et al. | 703/15 |
| 6,243,852 B1 | 6/2001 | Yoshikawa | 716/18 |
| 6,292,131 B1 | 9/2001 | Dupenloup | 716/18 |

FOREIGN PATENT DOCUMENTS

WO        WO95/27948        4/1995

OTHER PUBLICATIONS

D. Brand et al., In the Driver's Seat of BooleDozer, IEEE International Conference on Computer Design: VLSI in Computers and Processors, pp. 518-521, Apr. 1994.
F. Ferranti et al., Functional Test Generation for Behaviorally Sequential Models, Proceedings Design Automation and Test in Europe, pp. 403-410, Mar. 2001.
Nijhar, T. P. K., "HDL-Specific Source Level Behavioural Optimisation", IEEE Proceedings: Computers and Digital Techniques, IEE, GB, vol. 144, No. 2, Mar. 1997, pp. 138-144.
Nijhar, T.P.K., "Source Level Optimisation of VHDL for Behavioural Synthesis," IEEE Proceedings: Computers and Digital Techniques, vol. 144, No. 1, Jan. 1997, pp. 1-6.

*Primary Examiner*—Sun James Lin
(74) *Attorney, Agent, or Firm*—Michael O. Scheinberg; Hilgers, Bell & Richards LLP (57) ABSTRACT

A system and method for providing correlation of HDL signal names in the structural gate level description. In one embodiment, an HDL behavioral description of a circuit is processed by a correlation compiler to identify intermediate signals. The behavioral description is modified to specify that the intermediate signals are primary outputs of the circuit. The modified behavioral description is then processed by a synthesis tool to generate a structural description corresponding to the modified behavioral description. The structural description includes as outputs the identified intermediate signals.

23 Claims, 11 Drawing Sheets

**Non-Correlation using Synthesis
(Prior Art)
FIGURE 1**

**Correlation using outputs
FIGURE 2**

```
module A (in_1, in_2, in_3, out)   ← 31
input in_1, in_2, in_3;            ← 32
output out;                        ← 33
assign int = in_1 & in_2;          ← 34
assign out = int & in_3;           ← 35
endmodule                          ← 36
```

```
module A (in_1, in_2, in_3, int, out)  ← 61
  input in_1, in_2, in_3;              ← 62
  output int, out;                     ← 63
  assign int = in_1 & in_2;            ← 64
  assign out = int & in_3;             ← 65
endmodule                              ← 66
```

Fig. 6

Correlation with constraints
FIGURE 7

Correlation with non-optimized Synthesis
FIGURE 8

Correlation using Process Encapsulation
FIGURE 9

```
module A_process_34 (in_1, in_2, int)
  input in_1, in_2;
  output int;
  assign int = in_1 & in_2;
endmodule
```

Fig. 11a

```
module A_process_35 (int, in_3, out)
  input int, in_3;
  output out;
  assign out = int & in_3;
endmodule
```

CORRELATION OF BEHAVIORAL HDL SIGNALS

This application is a continuation of U.S. patent application Ser. No. 09/741,698 filed Dec. 19, 2000 now U.S. Pat. No. 6,557,160, which claims priority from U.S. Provisional Patent Application No. 60/171,416 filed Dec. 21, 1999, both of which are hereby incorporated by reference.

TECHNICAL FIELD OF THE INVENTION

The present invention relates generally to computers and more specifically to systems and methods for enhancing observability of circuit designs described using behavioral level HDLs.

BACKGROUND OF THE INVENTION

Digital circuit design is a complicated process. Initially, designers could design integrated circuits at the gate level. In other words, the designers would determine the particular arrangement and interconnection of logic gates (e.g., NAND or NOR gates) which would achieve the desired functionality. The physical layout of the logic gates could then be determined and the corresponding physical device constructed.

As the size and complexity of integrated circuits has increased, various automation tools have been developed to assist designers in their work. For example, physical layout EDA (Electronic Design Automation) tools can accept a structural gate level description and generate a physical configuration for the circuit. This provided designers with a level of abstraction which simplified the design process. This was the prevalent starting point for the design process until further increases in complexity required a higher level of abstraction.

Currently, typical circuit design methodology involves providing an abstracted description of the circuit and transforming it into a structural description with an aid of a synthesis tool. In other words, behavioral descriptions of various sub-components within the circuit are generated and then transformed by the synthesis tool into structural, gate level descriptions of the sub-components and the circuit.

At the behavioral level, a circuit (or sub-component of a circuit) can be described in terms of the inputs to the circuit, the outputs from the circuit, and the processes which are performed by the circuit and thereby transform the input signals into the output signals. The behavioral characterization of the circuit is normally provided in an HDL module or entity. HDL is an acronym for Hardware Description Language. HDLs are specifically designed to provide a means for specifying the behavior of a digital system or design at various levels of abstraction. (The terms "design" and "digital system" are used interchangeably throughout this description.) HDLs have evolved into two standards: Verilog and VHDL.

An HDL behavioral description is an abstraction of how a digital system works. This description is essentially a "black box" with a certain set of inputs and a certain set of outputs. The manner in which the outputs are generated from the inputs is described functionally, but not in terms of the specific arrangement of logic gates.

The HDL behavioral description is transformed into a gate-level structural description of the circuit by a synthesis tool. The synthesis tool reads the HDL behavioral description and generates a corresponding description which consists of a list of logic gates and the interconnections between the gates.

The synthesis tool is configured to optimize the generated design. In other words, if a particular set of functions can be performed either by a single gate component or a series of interconnected components, the synthesis tool will normally selected the single component, which would typically be configured to perform the function in a faster and more efficient manner.

While this optimization is typically desirable, there are situations in which it would be preferable to prevent full or partial optimization of the functional design. For instance, in order to easily debug the design, it may be helpful to have access to certain signals which are internal to the circuit. Thus, rather than simply being able to observe the inputs to the circuit and outputs from circuit, a designer could observe intermediate signals which allow him or her to isolate errors within particular portions of the circuit.

SUMMARY OF THE INVENTION

One or more of the problems outlined above may be solved by the various embodiments of the invention. Broadly speaking, the invention comprises systems and methods for enhancing the observability of circuit designs which are described using behavioral level HDLs. The systems and methods may, for example, provide means for correlating HDL behavioral description signal names to signals in the structural gate level description of the design.

In one embodiment, an HDL behavioral description of a circuit is processed by a correlation compiler to identify intermediate signals. The behavioral description is modified to specify that the intermediate signals are primary outputs of the circuit. The modified behavioral description is then processed by a synthesis tool to generate a structural description corresponding to the modified behavioral description. The structural description includes as outputs the identified intermediate signals.

In another embodiment, an HDL behavioral description of a design is provided in the same manner as in the first embodiment. In this instance, however, the HDL behavioral description is not modified by the correlation compiler. Instead, the correlation compiler generates a set of constraints that are formatted for use by the synthesis tool. These constraints, along with the original HDL behavioral description, forming a constrained HDL behavioral description which the synthesis tool transforms into a structural, gate level description.

In another embodiment, an HDL behavioral description is provided to a non-optimizing synthesis tool, rather than to a separate correlation compiler. The non-optimizing synthesis tool incorporates the functions of the correlation compiler described in the previous embodiments, but does not necessarily generate a modified behavioral description. The non-optimizing synthesis tool may instead provide various internal data structures and functions for identifying intermediate signals that are to be maintained in the structural description of the circuit.

In yet another embodiment, the initial HDL behavioral description is processed by a correlation compiler to generate a modified HDL behavioral description. The HDL behavioral description is modified in this embodiment by encapsulating each process which is contained in the description. That is, each process is identified and an independent HDL behavioral description corresponding to the process is generated. The individual HDL behavioral descriptions are then fed to the synthesis tool for processing. The synthesis tool generates a structural description for each of the individual HDL behavioral descriptions. These structural descriptions are then integrated to produce a structural description of the entire design. Depending upon the particular embodiment, the individual structural descriptions may be integrated into a single structural description for the entire circuit by either the synthesis tool or the correlation compiler.

BRIEF DESCRIPTION OF THE DRAWINGS

Other objects and advantages of the invention may become apparent upon reading the following detailed description and upon reference to the accompanying drawings in which.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the spirit and scope of the present invention as defined by the appended claims.

DETAILED DESCRIPTION OF THE INVENTION

A preferred embodiment of the invention is described below. It should be noted that this and any other embodiments described below are exemplary and are intended to be illustrative of the invention rather than limiting.

Generally speaking, the present systems and methods enhance the observability of circuit designs which are described using behavioral level HDLs. The present systems and methods may, for example, provide means for correlating HDL behavioral description signal names to signals in the structural gate level description of the design. In various embodiments, a correlation compiler may be configured to modify the HDL behavioral description to specify that intermediate signals are primary outputs of the described circuit, thereby preventing the elimination of these signals through optimization. In other embodiments, the correlation compiler may generate constraints which force a synthesis tool to maintain the intermediate signals in the structural description of the circuit. In other embodiments, these functions may be incorporated into the synthesis tool itself, so that equivalent data is stored internally and used in the same manner as the constraints or modifications of the behavioral description. These variations will be described in more detail below.

An HDL module or entity is a self-contained block of HDL descriptions that can reused through instantiation. HDL modules/entities contain processes and instantiations of other modules/entities. HDL module corresponds to the definition of module in the Verilog HDL. HDL entity corresponds to the definition of entity in the VHDL HDL. The terms HDL module and HDL entity are used interchangeably throughout this description.

An HDL process is the basic essence of the HDL behavioral description. A process can be thought of as independent concurrent thread of control. HDL processes are integral part of HDL module/entity.

An HDL gate is an HDL module/entity which describes a generic logic function or technology specific logic function (for example, a NAND gate).

An HDL object is a self-contained independent block within the HDL description that can be reused through instantiation. HDL objects can be defined explicitly and implicitly. Explicit HDL objects are formally defined within the HDL description. Examples of explicit HDL objects are HDL module/entities and HDL gates. Implicit HDL objects are described in a non-HDL (HDL tool specific) format or implied through the internal data structure of a HDL tool.

A structural gate level description is the representation of the design in terms of logic gates or technology specific components. The structural description is typically in the form of a netlist which lists the logic components and the interconnections between them. This representation can be described using HDLs or specific formats such as EDIF, or XNF. Typically, the structural gate level description is the output of the synthesis process (which is the process of transforming an HDL behavioral description into a structural, gate level description).

Figure 1:
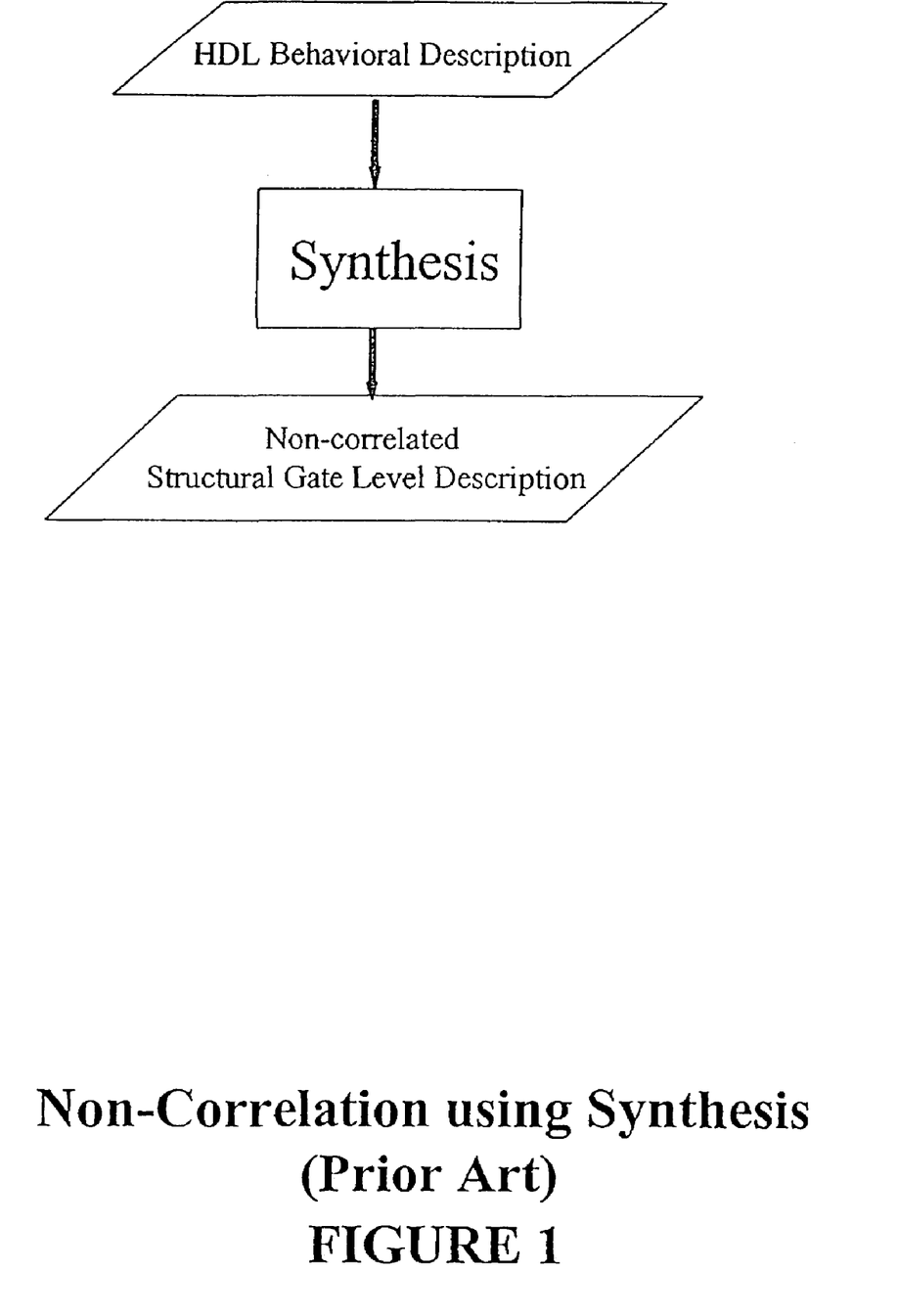
FIG. 1 is a diagram illustrating a prior art method for converting an HDL behavioral description of a circuit into a structural description of the circuit.

FIG. 1 shows a prior art method for converting an HDL behavioral description of a design into a structural, gate-level description. As shown in FIG. 1, the task of converting the behavioral description into a structural description is referred to as "synthesis". Normally, the synthesis task is performed on the behavioral description as a whole. That is, the description is treated as a "black box" characterized by a set of inputs, a set of outputs and a set of processes which are performed within the black box to generate the outputs from the inputs.

The synthesis of the structural description of the design is configured in prior art systems to optimize the design so that the structural description incorporates a minimal number of components or propagation levels. The intent of this optimization is to decrease the costs and increased the efficiency of the design at the structural level. The process, however, proceeds without regard to the observability of signals within the black box. Particular intermediate signals may therefore be optimized out of existence. Alternatively, these intermediate signals may be renamed in the synthesis process. Consequently, it may be impossible to identify these HDL signals within the resulting gate level design. The inability to identify these signals and to use them for debugging purposes may lead to problems in identifying flaws in the design.

Figure 2:
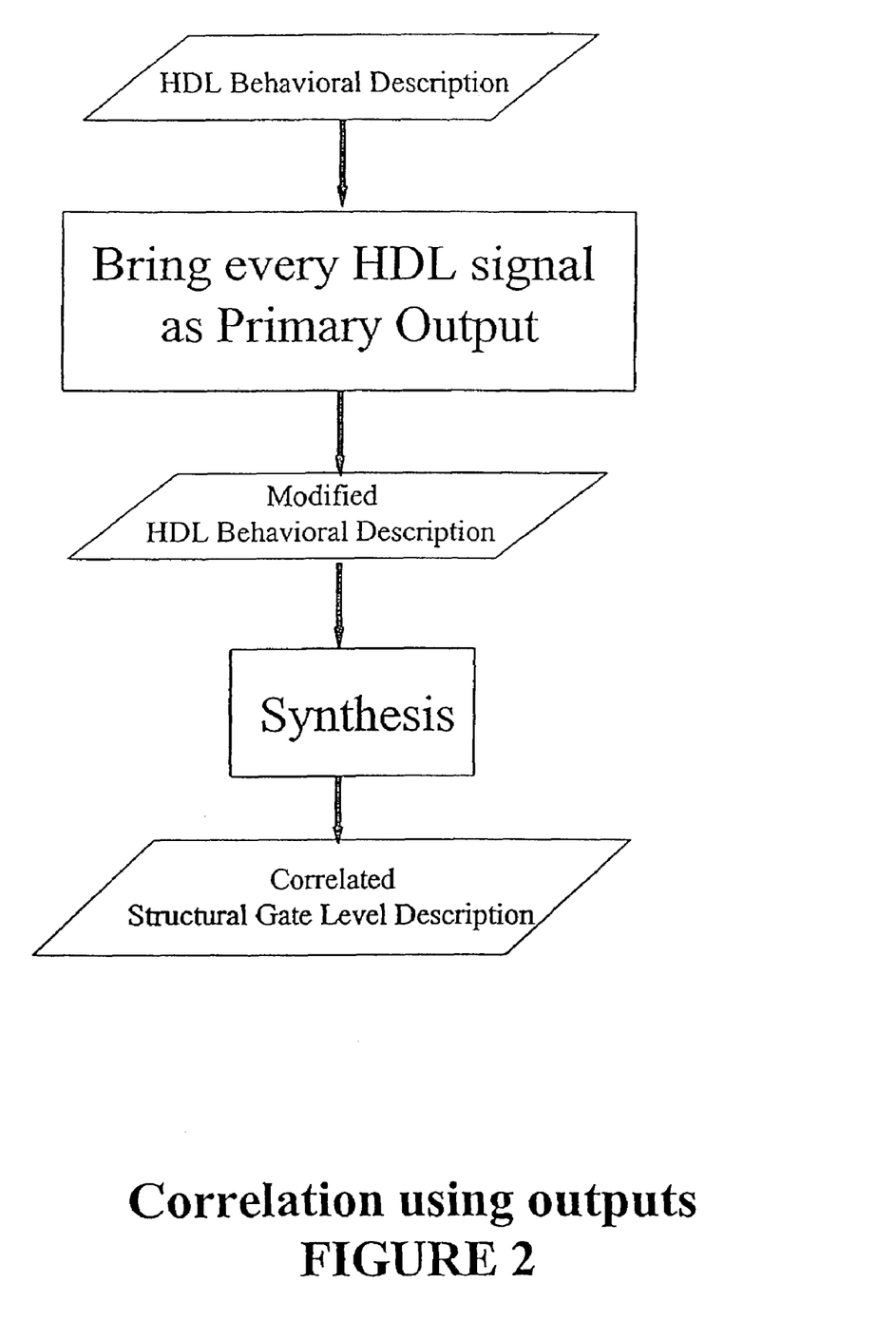
FIG. 2 is a diagram illustrating one embodiment of the present method in which a modified behavioral description of the circuit generated by a correlation compiler is provided to a synthesis tool for generation of the structural description of the circuit.

Referring to FIG. 2, a diagram illustrating one embodiment of the present method is shown. In this method, the behavioral description of the design is modified so that every signal incorporated in the description is identified as a primary output of the design. Then, the synthesis task is performed on the modified behavioral description to generate a structural description of the design. Because each of the signals in the modified behavioral description is a primary output of the design, none of these signals can be optimized away. The synthesis tool is constrained to maintain or correlate the signals and corresponding names in the generated structural description.

Broadly speaking, the process of modifying the HDL behavioral description comprises parsing the behavioral description, identifying intermediate signals within the behavioral description, determining the type and direction of the intermediate signals, and generating the modified behavioral description which specifies that the intermediate signals are primary outputs of the design. This process may be broken down further to include such tasks as building a database, identifying the direction of signals, identifying whether signals are associated with wire, registers or other data types, and following other syntactical and semantical rules of the HDL.

By performing the synthesis task on the whole HDL behavioral description, any HDL signal that are not primary outputs of the design can be optimized away and/or transformed (in non-deterministic way) to a different name in the resulting synthesized structural gate level description. Thus, the resulting structural gate level is not correlated with its HDL behavioral description.

Figure 3:
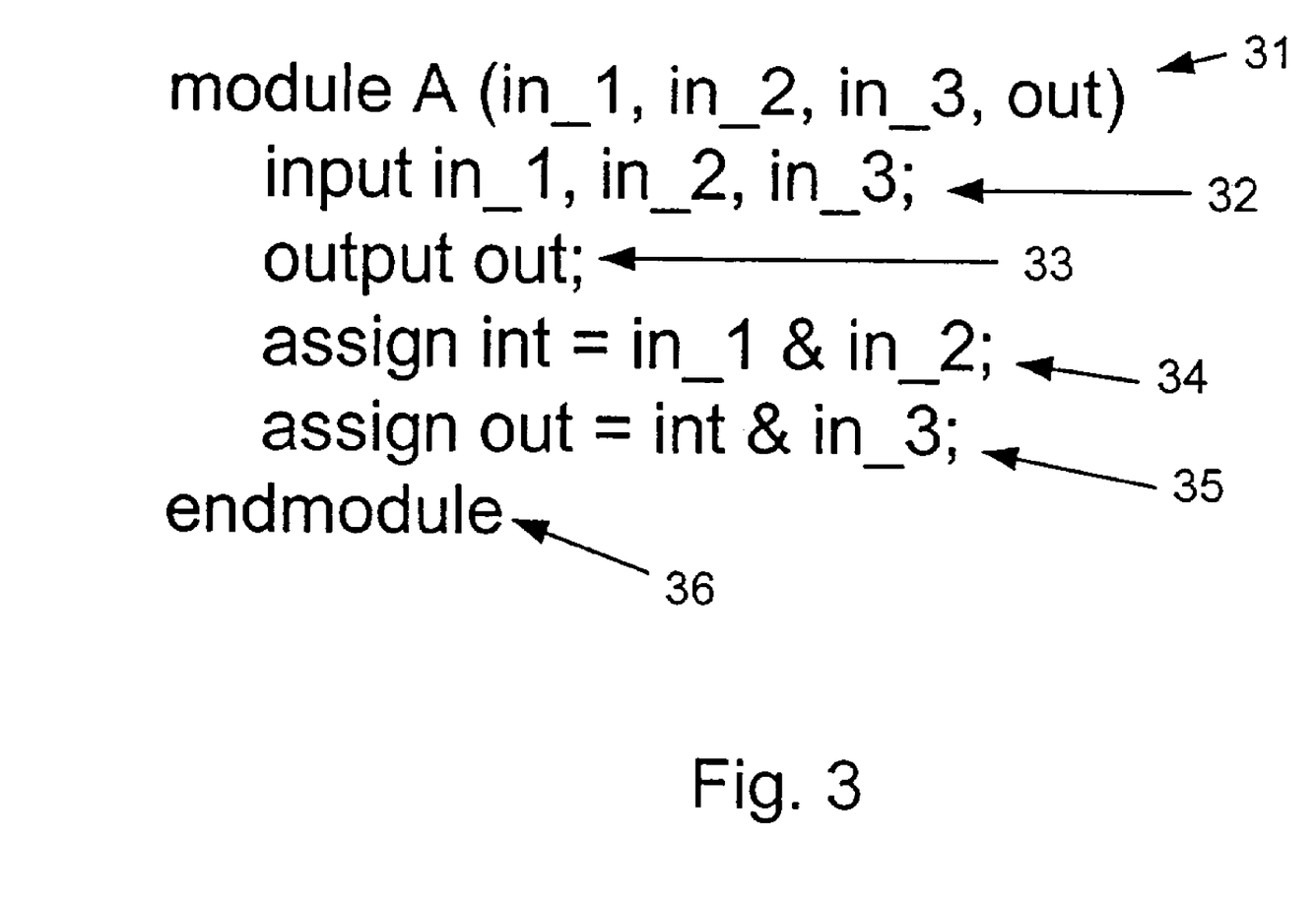
FIG. 3 is an example of an HDL behavioral description in one embodiment.

Referring to FIG. 3, an example of an HDL module is shown. The HDL module shown in this example comprises only a few lines which define the inputs, outputs and processes of the corresponding circuit design. More specifically, the module comprises a module declaration 31, the declaration of inputs to the circuit 32, a declaration of outputs from the circuit 33, two lines which defined in the processes performed by the circuit 34 and 35, and a delimiter identifying the end of the module 36.

Figure 4:
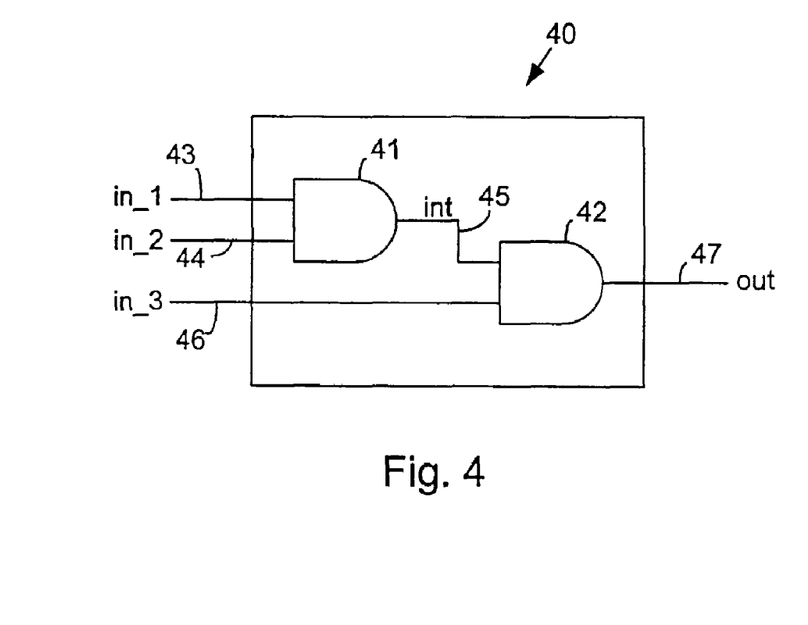
FIG. 4 is an illustration of a gate-level design corresponding to the behavioral description of FIG. 3, wherein the design includes the intermediate signal int.

Referring to FIG. 4, a gate level circuit design 40 corresponding to the HDL module of FIG. 3 is shown. Circuit 40 comprises two AND gates 41 and 42. Gate 41 has two inputs, 43 and 44, and one output 45. Input 43 carries signal in_1, while input 44 caries signal in_2. It can be seen from this figure that the output of gate 41 is coupled to one of the inputs of gate 42. The signal which is carried from the output of gate 41 to the input of gate 42 it is intermediate signal int. The other input of this gate, input 46, carries a signal in_3. Output 47 of gate 42 carries the output signal out.

It is clear that the logic circuit illustrated in FIG. 4 corresponds directly to the behavioral description specified by module A of FIG. 3. That is, each of the signals identified in module A appears in the gate level design. It can also be seen that each of the processes in module A (34 and 35) corresponds to one of the logic (AND) gates in the circuit. If it were necessary to debug the gate level design, the designer (tester) would have access to all of the signals, including the input signals (in_1, in_2 and in_3,) the output signal (out) and the intermediate signal (int.)

Figure 5:
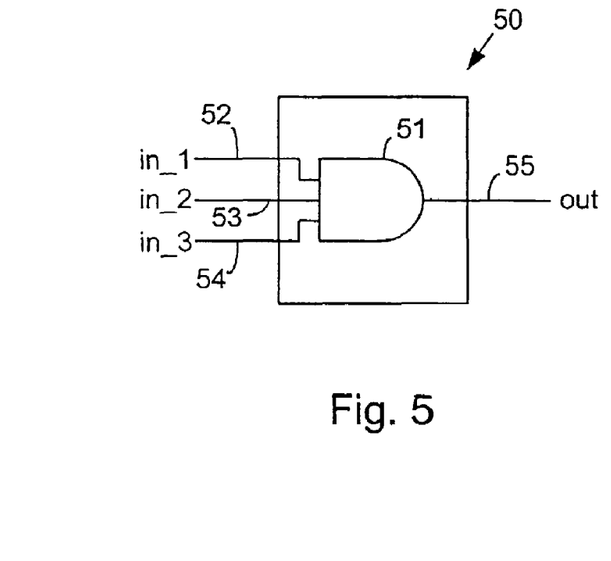
FIG. 5 is an illustration of an optimized gate-level design corresponding to the behavioral description of FIG. 3, wherein the design does not maintain the intermediate signal int.

Referring to FIG. 5, a second gate level circuit design 50 is shown. Circuit 50 includes only a single component, three-input and gate 51. Inputs 52–54 of gate 51 carry signals in_1, in_2 and in_3. Output 55 carries signal out. While circuit 50 also corresponds to the behavioral description of module a shown in FIG. 3 (i.e., it accepts the same input signals and generates the same output signal,) it does not include the intermediate signal, int.

Circuit 50 is representative of the typical structural circuit description generated by prior art synthesis tools. In other words, it is an optimized design which uses less components than circuit 40 and is presumably faster and more efficient. It is, however, impossible in this circuit to observe the intermediate signal, int, because it does not exist in the optimized design. (While it may not be particularly important to ensure that the intermediate signal in a simple design such as this is observable at the structural level, more complex circuits may have substantially more intermediate signals and may therefore present a substantially greater need to have access to the signals for debugging purposes.)

Referring again to FIG. 2, a behavioral description for which it desired to maintain the intermediate or internal signals of the design can be modified so that these signals will be maintained in the resulting structural description. It may be necessary in some instances (e.g., to avoid duplication of names) to generate a correlated name rather than maintaining the identical name.

As shown in the figure, the initial HDL module (module A in the example above) is processed by a correlation compiler to generate a modified HDL module. The modified HDL module is then processed by the synthesis tool to generate a structural description of the circuit described by the initial HDL module.

The correlation compiler is configured to analyze the initial HDL module to identify the intermediate signals. For example, in the example of FIGS. 3 and 4, the signal int would be identified. The correlation compiler would then modify the HDL module to identify the intermediate signal as a primary output signal. Because the intermediate signal is described in the modified HDL modle as a primary output signal, the synthesis tool will ensure that the signal is provided in the generated structural description. This signal will therefore be available to the designer for testing purposes.

Figure 6:
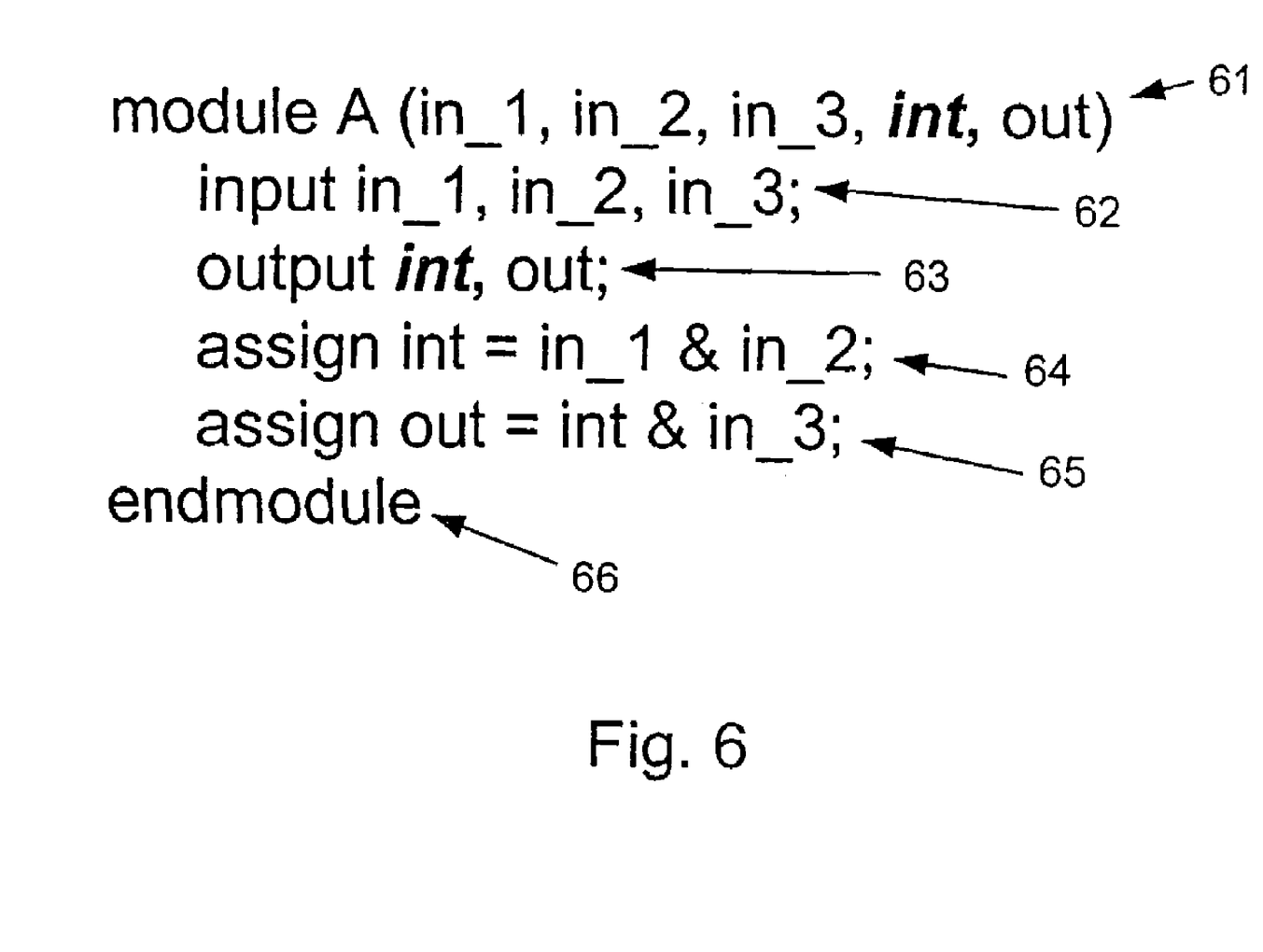
FIG. 6 is a modified behavioral description corresponding to the initial behavioral description of FIG. 3, wherein the signal int is declared as a primary output.

Referring to FIG. 6, the modified HDL module for the above sample is shown. It can be seen from this figure that several lines of the initial HDL module (see FIG. 3) have been modified by the correlation compiler. First, the declaration of the module (61) has been modified so that the declaration now includes intermediate signal int. The declaration of output signals (63) within the module has also been modified to explicitly declare int as a primary output signal. The remainder of the modified HDL module is identical to the initial HDL module shown in FIG. 3. When the modified HDL module is processed by the synthesis tool, the tool will be constrained to maintain intermediate signal int, since it has been declared as a primary output. Thus, the generated structural description would correspond to the gate configuration shown in FIG. 4 rather than the one shown in FIG. 5.

Figure 7:
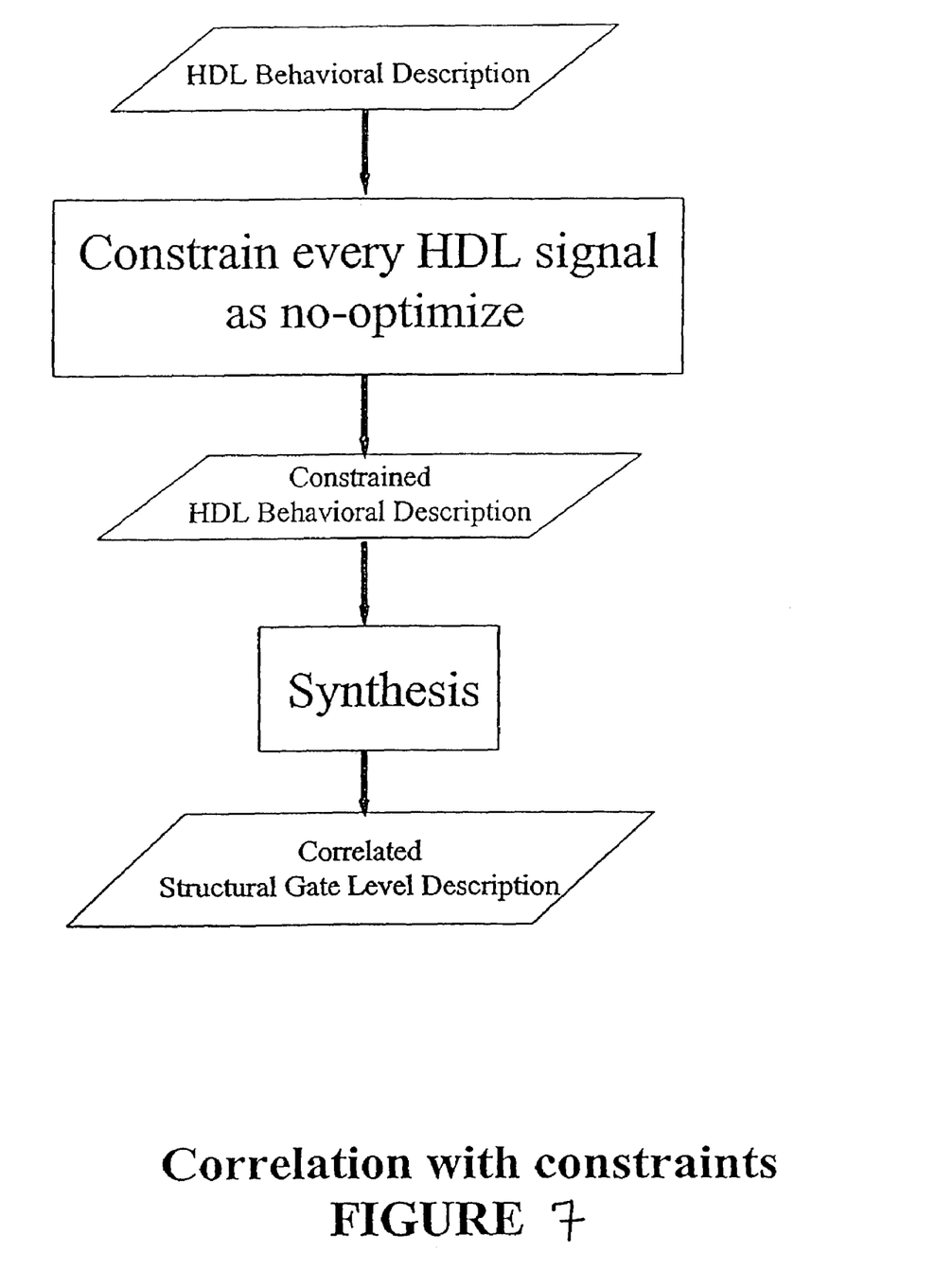
FIG. 7 is a diagram illustrating a second embodiment of the present method in which a correlation compiler generates one or more constraints which are configured to maintain the intermediate signals of a behavioral description in the corresponding structural description.

Referring to FIG. 7, a second embodiment of the present method is shown. In this embodiment, an HDL behavioral description of a design is provided in the same manner as in the first embodiment. In this instance, however, the HDL behavioral description is not modified by the correlation compiler. Instead, the correlation compiler generates a set of constraints that are formatted for use by the synthesis tool. These constraints, along with the original HDL behavioral description, forming a constrained HDL behavioral description which the synthesis tool transforms into a structural, gate level description.

Various prior art synthesis tools are configured to allow certain constraints to be specified, wherein the constraints are honored (implemented) in the transformation of the behavioral description to a structural description. The constraints control the transformation performed by the synthesis tool, but do not actually affect the HDL behavioral description which is provided to the synthesis tool. This situation is distinct from the previously described embodiment, in which the HDL behavioral description is itself modified prior to being transformed by the synthesis tool.

Figure 8:
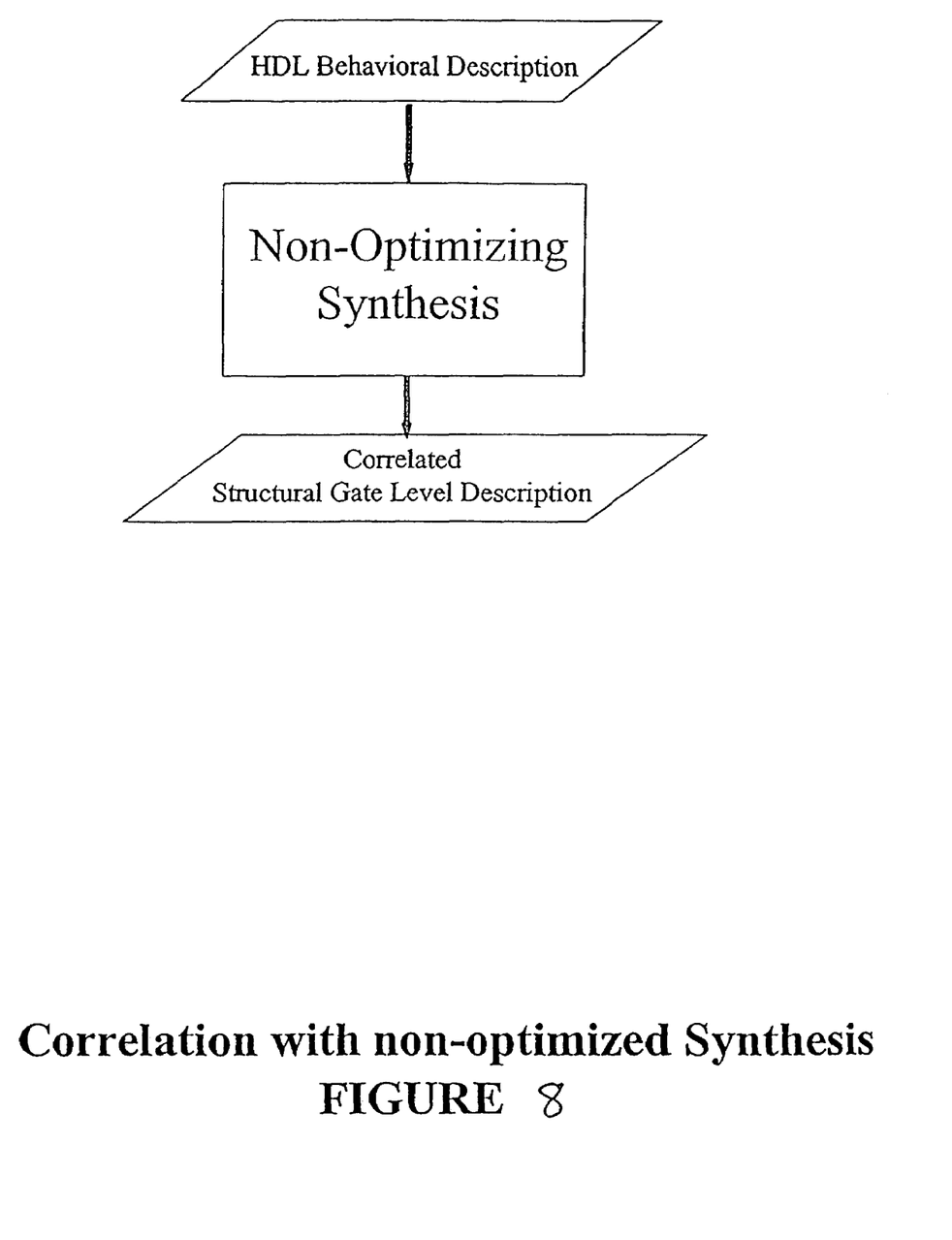
FIG. 8 is a diagram illustrating a third embodiment of the present method in which the functions of the correlation compiler are integrated into a non-optimizing synthesis tool.

Referring to FIG. 8, a third embodiment of the present method is shown. In this embodiment, an HDL behavioral description is provided to a non-optimizing synthesis tool, rather than to a separate correlation compiler. The non-optimizing synthesis tool incorporates the functions of the correlation compiler, but does not necessarily generate a modified behavioral description. The non-optimizing synthesis tool may instead provide various internal data structures and functions for identifying intermediate signals that are to be maintained in the structural description of the circuit.

In the embodiment of FIG. 8, essentially the same processes are being carried out by the non-optimizing synthesis tool up as are carried out by the correlation compiler and synthesis tool in the embodiment of FIG. 2. The embodiment of FIG. 8 might be considered a less general case of the present method because the synthesis tool must be designed such that it incorporates the functions of the correlation compiler. The embodiment of FIG. 2 might be considered more general because, once the correlation compiler generates the modified HDL behavioral description, the modified description can be provided to any synthesis tool which is configured to read the corresponding type of HDL files for generation of the structural circuit description.

Figure 9:
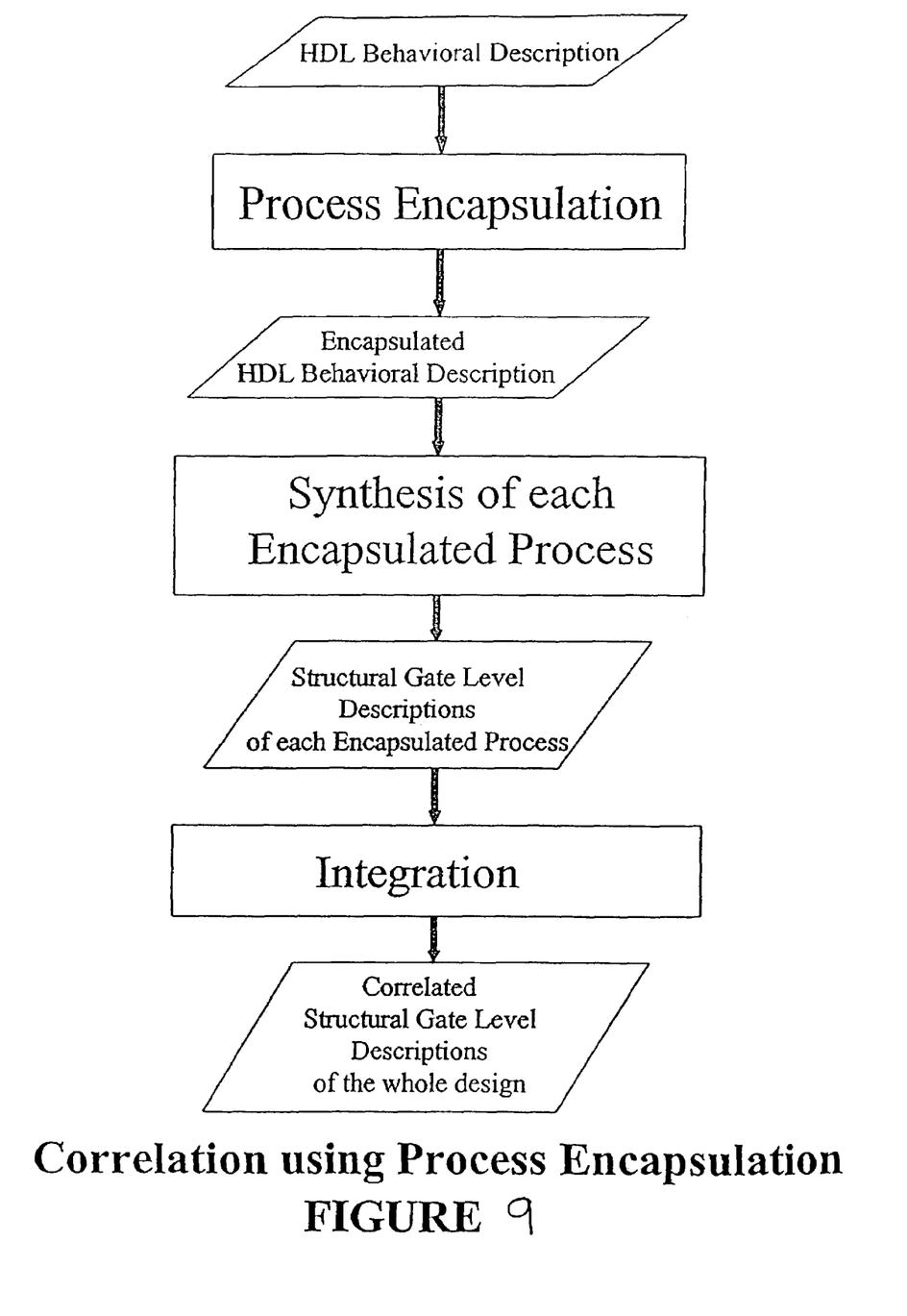
FIG. 9 is a diagram illustrating a fourth embodiment of the present method in which each process of a behavioral description is encapsulated to form an independent behavioral description which is synthesized into a separate structural description which is integrated into a circuit-level structural description.

Referring to FIG. 9, another embodiment of the present method is shown. In this embodiment, the initial HDL behavioral description is processed by a correlation compiler to generate a modified HDL behavioral description. The HDL behavioral description is modified in this embodiment by encapsulating each process within the description. That is, each process is identified and an independent HDL behavioral description corresponding to that process is generated. The individual HDL behavioral descriptions are then fed to the synthesis tool for processing. The synthesis tool generates a structural description for each of the individual HDL behavioral descriptions. These structural descriptions are then integrated to produce a structural description of the entire design. Depending upon the particular embodiment, the individual structural descriptions may be integrated into a single structural descriptions for the entire circuit by either the synthesis tool or the correlation compiler.

By encapsulating each of the processes which is contained in the behavioral description, the intermediate signals which convey information to and from each process are effectively transformed into primary inputs and outputs of the corresponding independent, process-level behavioral descriptions. Consequently, the intermediate signals cannot be optimized away by the synthesis tool. The intermediate signals are therefore accessible in the integrated structural description.

Figure 10:
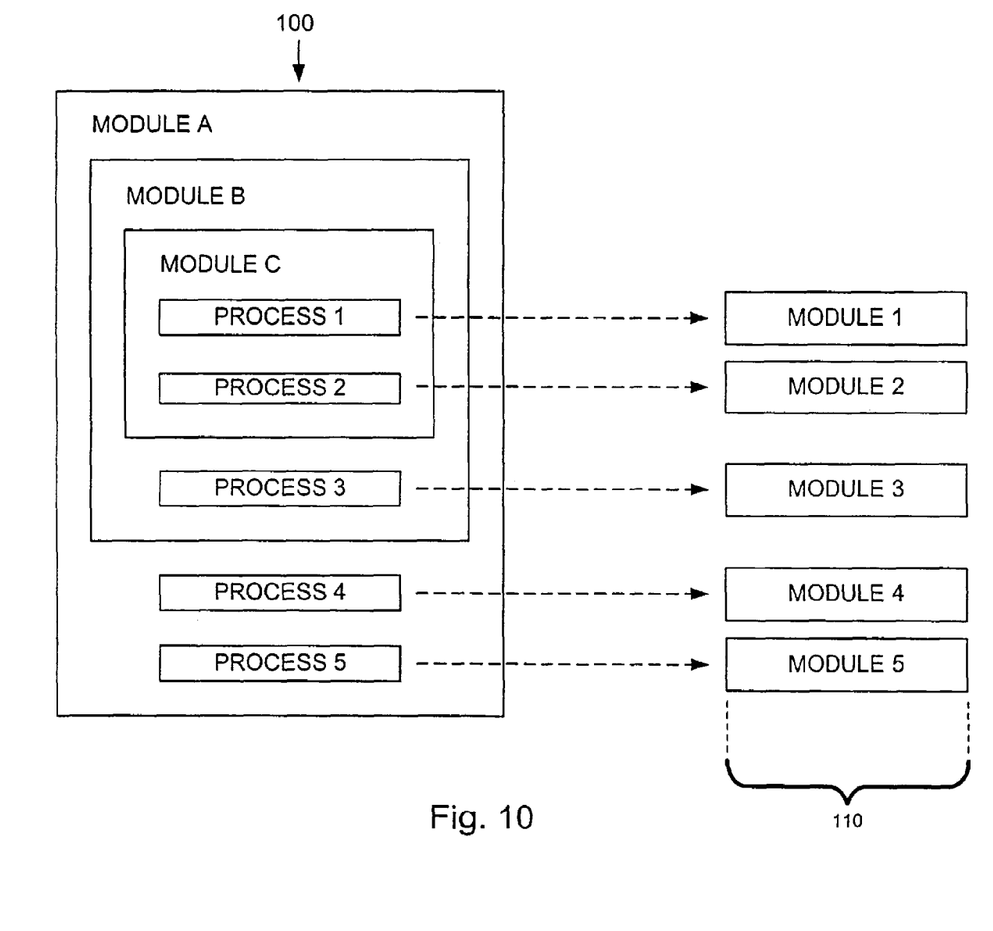
FIG. 10 is a diagram illustrating the structure of an behavioral description and a corresponding set of separate behavioral descriptions corresponding to each of the processes within the initial behavioral description.

Referring to FIG. 10, a diagram illustrating the structure of an HDL behavioral description 100 prior to processing and a corresponding set of encapsulated processes 110 is shown. It can be seen in this figure that the behavioral description comprises a plurality of modules which, in this case, are nested within one another. (It should be noted that the behavioral description may comprise a single module, or a plurality of modules which are interrelated in a manner other than that shown in FIG. 10.) In the behavioral description of FIG. 10, module C contains process 1 and process 2, module B contains module C and process 3, and module A contains module B, process 4 and process 5.

In the encapsulation process, a module is generated for each of the processes contained in the initial behavioral description (the behavioral description prior to processing.) when the module corresponding to each process is generated, the new module will obviously inherit the necessary process definitions from its parent module(s). Some of the declarations and other statements in the new HDL module may also be inherited directly from the parent module(s), while others may be implicit in the parent module(s).

Figure 11A:
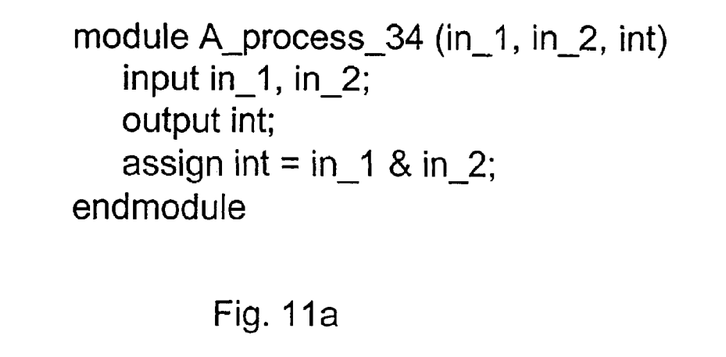
FIGS. 11a and 11b are modified behavioral descriptions corresponding to the processes contained within the behavioral description of FIG. 3.
Figure 11B:
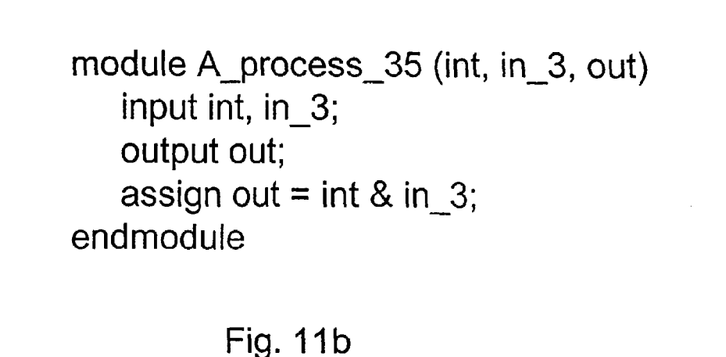

For example, referring to module A of FIG. 3, there are two processes, 34 and 35. In producing a module corresponding to process 34, it can be seen that this process generates an output int from two inputs, in_1 and in_2. While inputs in_1 and in_2 are explicitly declared in module A, the fact that int is an output is inherent in the assignment of a value (in_1 & in_2) to this signal. In the new HDL module corresponding to process 34, these inputs and outputs are all explicitly declared. Thus, the new module for process 34 would appear as shown in FIG. 11*a*. The new module for process 35 would appear as shown in FIG. 11*b*.

Figure 12:
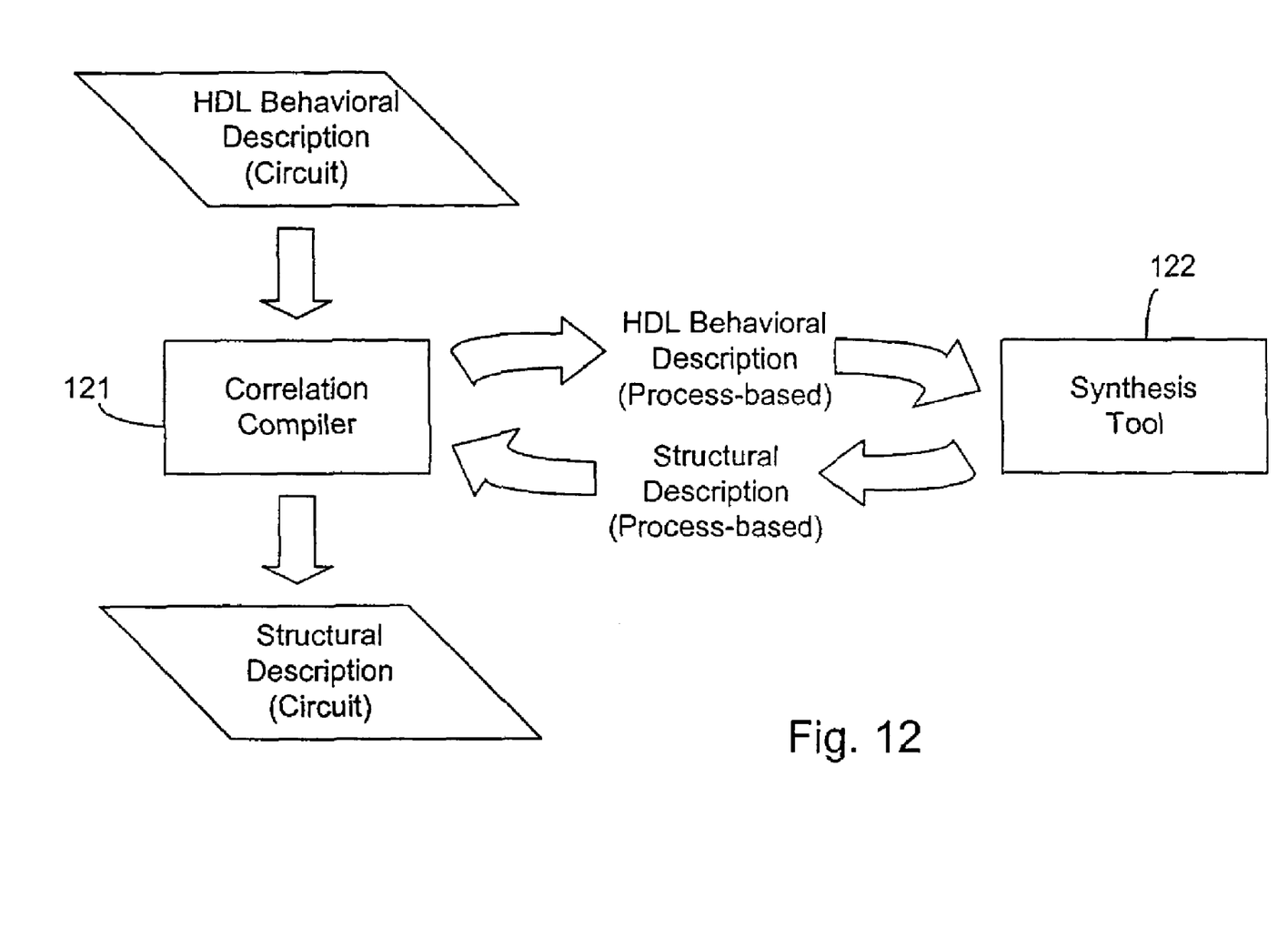
FIG. 12 is an illustration of a system in which a correlation compiler generates individual behavioral descriptions corresponding to each of the processes within an initial behavioral description and conveys the individual behavioral descriptions to a synthesis tool which generates corresponding structural descriptions for each of the processes and conveys them back to the correlation compiler for reconstruction into a single, circuit-level structural description.

In one embodiment, the encapsulation process is performed in a system configured as shown in FIG. 12. In this embodiment, the initial HDL behavioral description is processed by the correlation compiler 121, which generates the individual modules corresponding to each of the processes in the description. As each of the new modules is generated, it is conveyed to the synthesis tool 122, which generates a structural description corresponding to the new module. This structural description is then processed back to the correlation compiler, which integrates the structural descriptions of the individual processes into the structural description of the entire circuit.

It should be noted that this configuration corresponds to one particular embodiment, and that other embodiments may have differing configurations. For example, in another embodiment, the individual structural descriptions may be reconstructed by the synthesis tool, rather than the correlation compiler. In yet another embodiment, the correlation compiler and synthesis tool may be integrated into a single system, so that it is not necessary to generate separate behavioral descriptions for each other processes. In this embodiment, the process and signal information may be stored in various data structures which are internal to the system and which contain the same information as the behavioral descriptions.

Those systems and methods described above can be implemented in various types of computer systems. The particular types of computers which may be suitable for this purpose will be apparent to persons of ordinary skill in the art, and may include general-purpose computers, specialized computers and processors and other computing systems. It is also contemplated that those systems and methods described above can be implemented in software applications which may be executed on one or more of these types of computers. These applications may be embodied in various types of computer-readable media such as floppy disks, CD-ROMs, magnetic tapes, RAM, and the like. This disclosure is contemplated to encompass all such implementations.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

The invention claimed is:

1. A system for generating a structural description of a circuit design based on a corresponding behavioral description comprising:
    a correlation compiler programmed to automatically modify an initial behavioral description by inserting one or more primary inputs or outputs corresponding to one or more intermediate signals in the circuit design; and
    a synthesis-tool coupled to the correlation compiler and configured to generate a structural description, wherein the structural description includes the one or more intermediate signals.

2. The system of claim 1 wherein the correlation compiler is configured to generate a modified behavioral description identifying the one or more intermediate signals as primary outputs and wherein the synthesis tool is configured to generate the structural description from the modified behavioral description.

3. The system of claim 1 wherein the correlation compiler is configured to parse the initial behavioral description, identify the one or more intermediate signals within the initial behavioral description and determine type and direction of the one or more intermediate signals.

4. The system of claim 1 wherein the correlation compiler is configured to identify a selected subset of all of the intermediate signals in the initial behavioral description.

5. The system of claim 1 wherein each of the one or more intermediate signals has a corresponding signal name and wherein the synthesis tool is configured to maintain the signal name corresponding to each of the one or more intermediate signals in generating the structural description.

6. The system of claim 1 wherein the correlation compiler is configured to modify the initial behavioral description by identifying each of a plurality of processes contained therein and encapsulating each of the plurality of processes in an intermediate behavioral description.

7. The system of claim 6 wherein the synthesis tool is configured to generate an intermediate structural description from each of the intermediate behavioral descriptions.

8. The system of claim 7 wherein the synthesis tool is configured to construct a first structural description from the intermediate structural descriptions.

9. The system of claim 1 wherein the correlation compiler is configured to generate one or more constraints based upon the one or more identified intermediate signals and wherein the synthesis tool is configured to generate the structural description from the behavioral description and the constraints.

10. A system for generating a structural description of a circuit design based on a corresponding behavioral description comprising:
    a correlation compiler programmed to automatically identify one or more intermediate signals in the corresponding behavioral description without using manually inserted indicators; and
    a synthesis tool coupled to the correlation compiler and configured to generate a structural description, wherein the structural description includes the one or more identified intermediate signals.

11. The system of claim 10 wherein the correlation compiler is configured to generate a modified behavioral description identifying the one or more intermediate signals as primary outputs and wherein the synthesis tool is configured to generate the structural description from the modified behavioral description.

12. The system of claim 10 wherein the correlation compiler is configured to parse the behavioral description, identify the intermediate signals within the initial behavioral description and determine the type and direction of the one or more intermediate signals.

13. The system of claim 10 wherein the correlation compiler is configured to identify a selected subset of all of the intermediate signals in the initial behavioral description.

14. The system of claim 10 wherein each of the one or more intermediate signals identified in the initial behavioral description has a corresponding signal name and wherein the synthesis tool is configured to maintain the signal name corresponding to each of the one or more intermediate signals in generating the structural description.

15. The system of claim 10 wherein the correlation compiler is configured to modify the behavioral description by identifying each of a plurality of processes contained therein and encapsulating each of the plurality of processes in an intermediate behavioral description.

16. The system of claim 15 wherein the synthesis tool is configured to generate an intermediate structural description from each of the intermediate behavioral descriptions.

17. A system for generating a structural description of a circuit design based on a corresponding behavioral description comprising:
    a correlation compiler programmed to automatically identify one or more intermediate signals in an initial behavioral description wherein the one or more intermediate signals are not primary outputs of the circuit design; and
    a synthesis tool coupled to the correlation compiler and configured to generate a structural description, wherein the structural description includes the one or more identified intermediate signals.

18. The system of claim 17 wherein the correlation compiler is configured to generate a modified behavioral description identifying the one or more intermediate signals as primary outputs and wherein the synthesis tool is configured to generate the structural description from the modified behavioral description.

19. The system of claim 18 wherein the correlation compiler is configured to parse the behavioral description, identify the one or more intermediate signals within the initial behavioral description and determine the type and direction of the one or more intermediate signals.

20. The system of claim 18 wherein the correlation compiler is configured to identify a selected subset of all of the intermediate signals in the initial behavioral description.

21. The system of claim 18 wherein each of the one or more intermediate signals identified in the initial behavioral description has a corresponding signal name and wherein the synthesis tool is configured to maintain the signal name corresponding to each of the one or more intermediate signals in generating the structural description.

22. The system of claim 18 wherein the correlation compiler is configured to modify the initial behavioral description by identifying each of a plurality of processes contained therein and encapsulating each of the plurality of processes in an intermediate behavioral description.

23. The system of claim 22 wherein the synthesis tool is configured to generate an intermediate structural description from each of the intermediate behavioral descriptions.

* * * * *